US006733099B2

(12) United States Patent
Masumoto

(10) Patent No.: US 6,733,099 B2
(45) Date of Patent: May 11, 2004

(54) WAVEFORM GENERATING CIRCUIT, INKJET HEAD DRIVING CIRCUIT AND INKJET RECORDING DEVICE

(75) Inventor: Kenichi Masumoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/297,501

(22) PCT Filed: Oct. 24, 2001

(86) PCT No.: PCT/JP01/09353

§ 371 (c)(1), (2), (4) Date: Dec. 5, 2002

(87) PCT Pub. No.: WO02/34529

PCT Pub. Date: May 2, 2002

(65) Prior Publication Data

US 2003/0151636 A1 Aug. 14, 2003

(30) Foreign Application Priority Data

Oct. 24, 2000 (JP) .................................... 2000-324019

(51) Int. Cl.[7] ........................ B41J 29/38; H02K 33/00; H02K 35/00; H02K 7/00; H03M 1/76

(52) U.S. Cl. ............................ 347/9; 347/10; 310/317; 341/148

(58) Field of Search ............................... 347/9, 10, 68; 310/316.01, 317; 318/116–8; 341/144, 148, 152

(56) References Cited

U.S. PATENT DOCUMENTS 5,631,675 A * 5/1997 Futagawa .................... 347/10

FOREIGN PATENT DOCUMENTS

JP 10-250061 9/1998

OTHER PUBLICATIONS

International Search Report, PCT/JP01/09353; ISA/JPO, Jan. 7, 2002.

* cited by examiner

*Primary Examiner*—Michael Brooke
(74) *Attorney, Agent, or Firm*—Harness, Dickey & Pierce, P.L.C.

(57) ABSTRACT

An inkjet head driving circuit driving piezoelectric actuators 21 for ink ejection provided on an inkjet head H is provided with an analog switch 71 (72) whose input can be switched between the output voltage of a D/A converter 62 (63) and ground potential, and outputs either that output voltage or ground potential to a waveform generating portion 64. The analog switch 71 (72) is configured such that when a digital signal for generating a voltage rising waveform (voltage falling waveform) with the waveform generating portion 64 is input into the D/A converter 62 (63), the input into the analog switch 71 (72) is switched from ground potential to the output voltage of the D/A converter 62 (63).

13 Claims, 4 Drawing Sheets

WAVEFORM GENERATING CIRCUIT, INKJET HEAD DRIVING CIRCUIT AND INKJET RECORDING DEVICE

TECHNICAL FIELD

The present invention belongs to the technical fields relating to waveform generating circuits generating voltage waveforms, inkjet head driving circuits driving actuators for ink ejection provided on an inkjet head, and inkjet recording devices provided with an inkjet head having actuators that are driven by such an inkjet head driving circuit.

BACKGROUND ART

Conventionally, inkjet heads having actuators for ink ejection are well known, and examples of such actuators of inkjet heads are piezoelectric actuators provided with electrodes on both sides of a piezoelectric element, which constitute a portion of a pressure chamber accommodating the ink. When a pulse-shaped voltage is applied to the electrodes of such an actuator, the actuator is deformed such that the volume of the pressure chamber is reduced, thus creating a pressure in the pressure chamber, which ejects ink drops from a nozzle that is in communication with the pressure chamber.

As shown for example in FIG. 4, the voltage waveform applied to the actuators is made of a first waveform P1 (voltage-falling waveform), at which the potential falls from ground potential to the minimum potential (−Vf), a second waveform P2 continuing the first waveform P1 and maintaining this minimum potential, a third waveform P3 (voltage-rising waveform) continuing the second waveform P2 and rising from the minimum potential to the maximum potential (Vf), a fourth waveform P4 continuing the third waveform P3 and maintaining this maximum potential, and a fifth waveform P5 (voltage falling waveform) continuing the fourth waveform P4 and returning from the maximum potential to ground potential. This series of first to fifth waveforms P1 to P5 constitutes one driving pulse P for ejecting one ink drop from the nozzle, and the driving pulse P is given out repeatedly with a predetermined period.

An example of a waveform generating circuit (inkjet head driving circuit) generating the voltage waveform (driving pulse P) for driving the actuator is shown in FIG. 6. In this drawing, numeral 101 is a CPU, which has two terminals outputting digital signals (for example of 8 bits) for generating the voltage waveform. A first D/A converter 102 for converting a digital signal into a positive analog signal and giving it out and a second D/A converter 103 for converting a digital signal into a negative analog signal and giving it out are connected to the digital signal output terminals of this CPU 101. The first and second D/A converters 102 and 103 receive from the CPU 101 a data set signal together with the digital signals but from a different terminal than the digital signals, and when this data set signal has been input and a predetermined time (data settling time) has elapsed after its input (after the output of the D/A converter 102 (or 103) has settled), the analog voltage is given out. The first D/A converter 102 is connected to a first power source 106 giving out a positive voltage, whereas the second D/A converter 103 is connected to a second power source 107 giving out a negative voltage.

A first and a second voltage/current converter 109 and 110 are respectively connected to the output terminals of the first and the second D/A converter 102 and 103, and these first and second voltage/current converters 109 and 110 convert the positive and the negative analog voltage into currents. The output terminals of the first and second voltage/current converters 109 and 110 are connected to a current/voltage converter amplifier 111, which amplifies the currents into which the voltages have been converted by the first and second voltage/current converters 109 and 110, and converts the amplified currents into a voltage. It should be noted that the first voltage/current converter 109, which is connected to the output terminal of the first D/A converter 102, is connected to the first power source 106, whereas the second voltage/current converter 110, which is connected to the output terminal of the second D/A converter 103, is connected to the second power source 107, and the current/voltage converter amplifier 111 is connected to both the first power source 106 and the second power source 107.

Based on the output voltage from the first and second D/A converters 102 and 103, the first and second voltage/current converters 109 and 110 and the current/voltage converter amplifier 111 generate voltage waveforms like the first to fifth waveforms P1 to P5. More specifically, when the first D/A converter 102 outputs a positive analog voltage and the second D/A converter 103 outputs ground potential, the voltage rising waveform (third waveform P3) is generated, whereas when the second D/A converter 103 outputs a negative analog voltage and the first D/A converter 102 outputs ground potential, the voltage falling waveforms (first and fifth waveforms P1 and P5) are generated. Furthermore, when both D/A converters 102 and 103 output ground potential, waveforms maintaining the potential directly before the output of those ground potentials (second and fourth waveforms P2 and P4) are generated, and the potential between neighboring driving pulses P is maintained at ground potential.

Then, the generated voltage waveform is applied to a multitude of actuators of the inkjet head, through a current amplifier 113, which is made of two transistors 113*a*, and a driver IC 114. The driver IC 114 includes for example switching transistors that are provided in accordance with the actuators, and, receiving print signals from the CPU 101, selects the actuators corresponding to the nozzles through which ink drops are to be ejected, thus applying the voltage waveform only to the selected actuators.

With a conventional waveform generating circuit as described above, when for example a voltage rising waveform is generated, a digital signal is input into the first D/A converter 102, which outputs a positive analog signal, whereas when the voltage rising waveform is not generated, it is necessary to output a voltage equal to ground potential (depending on the voltage waveform to be generated, there is no limitation to ground potential, and it can be a constant predetermined voltage that is midway between the maximum value and the minimum value of the output voltage of the first D/A converter 102). Furthermore, when the voltage falling waveform is not generated, the output voltage of the second D/A converter 103 needs to be set to ground potential (depending on the voltage waveform to be generated, there is no limitation to ground potential, but can be a constant predetermined voltage that is midway between the maximum value and the minimum value of the output voltage of the second D/A converter 103).

However, due to variations in the characteristics of the D/A converters 102 and 103, it may happen that a voltage that is slightly different from ground potential (or the predetermined voltage) is output, and in the case of such variations in the characteristics, malfunctioning occurs in the current/voltage converter amplifier 111, and a precise voltage waveform cannot be generated anymore.

In view of these facts, it is an object of the present invention to prevent malfunctioning due to variations in the characteristics of the D/A converters with a simple configuration, by improving the configuration of the above-described waveform generating circuit.

DISCLOSURE OF THE INVENTION

In order to attain these objects, the present invention is provided with a switching means whose input can be switched between the output voltage of a D/A converter and a predetermined voltage that is held constant, and which outputs one of those two output voltages to a waveform generating portion, wherein the input into the switching means is switched as necessary.

More specifically, according to a first invention, a waveform generating circuit includes at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and a switching means, whose input can be switched between the output voltage of the D/A converter and a predetermined voltage that is held constant, and which outputs one of those two output voltages to the waveform generating portion, wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter.

With this configuration, when a voltage rising waveform or a voltage falling waveform is not generated, the input into the switching means is set to a predetermined voltage that is held constant (for example, the output voltage of a constant voltage source or ground potential), and when a voltage rising waveform or a voltage falling waveform is generated, the input into the switching means is switched from this predetermined voltage to the output voltage of the D/A converter. As a result, when neither a voltage rising waveform nor a voltage falling waveform are generated, a predetermined voltage can be output to the waveform generating portion from, for example, a constant voltage source that can output a precise voltage, even if the D/A converter outputs a voltage that is slightly different from the predetermined voltage due to variations in the characteristics of the D/A converter, so that it is possible to prevent, with a simple configuration, malfunctioning of the waveform generating portion due to variations in the characteristics of the D/A converter.

According to a second invention, in the first invention, the switching means is configured such that the input into the switching means is switched from the predetermined voltage to the output voltage of the D/A converter after the output of the D/A converter has settled.

That is to say, the time from the input of the data set signal until the output of the D/A converter is settled fluctuates depending on the output voltage of the D/A converter and variations in its characteristics, so that if there is no switching means, or even if there is the switching means, but the input into the switching means is switched to the output voltage of the D/A converter before the output of the D/A converter has settled, then the result is variations in the generation timing (output timing) of the voltage rising waveform or the voltage falling waveform by the waveform generating portion. However, in this invention, the input into the switching means is switched to the output voltage of the D/A converter only after the output of the D/A converter has settled, so that the voltage rising waveform or voltage falling waveform can be generated and output substantially at the same time as the switching of the input into the switching means. As a result, variations in the waveform generating timing brought about by fluctuations in the output settling time of the D/A converter can be prevented.

According to a third invention, a waveform generating circuit includes at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and a switching means, whose input can be switched between the output voltage of the D/A converter and a predetermined voltage that is held constant, and which outputs one of those two output voltages to the waveform generating portion, wherein the switching means is configured such that when the digital signal for generating a voltage rising waveform or a voltage falling waveform with the waveform generating portion is not input into the D/A converter, the input into the switching means is set to the predetermined voltage.

Here, just like in the first invention, when a voltage rising waveform or a voltage falling waveform is not generated, a precise predetermined voltage can be output to the waveform generating portion, so that it is possible to prevent malfunctioning of the waveform generating portion due to variations in the characteristics of the D/A converter.

According to a fourth invention, a waveform generating circuit includes a first D/A converter that converts a digital signal into a positive analog voltage and outputs the analog voltage, a second D/A converter that converts a digital signal into a negative analog voltage and outputs the analog voltage, a first switching means, whose input can be switched between the output voltage of the first D/A converter and ground potential, and which outputs either that output voltage or ground potential, a second switching means, whose input can be switched between the output voltage of the second D/A converter and ground potential, and which outputs either that output voltage or ground potential, and a waveform generating portion, which generates a voltage rising waveform when the first switching means outputs the output voltage of the first D/A converter and the second switching means outputs ground potential, and which generates a voltage falling waveform when the first switching means outputs ground potential and the second switching means outputs the output voltage of the second D/A converter, wherein the first switching means is configured such that when the digital signal for generating a voltage rising waveform with the waveform generating portion is input into the first D/A converter, then the input into the first switching means is switched from ground potential to the output voltage of the first D/A converter, and wherein the second switching means is configured such that when the digital signal for generating a voltage falling waveform with the waveform generating portion is input into the second D/A converter, then the input into the second switching means is switched from ground potential to the output voltage of the second D/A converter.

Thus, when the voltage rising waveform is not generated, ground potential can be output precisely to the waveform generating portion with the first switching means, even when the output voltage of the first D/A converter cannot be set precisely to ground potential. Moreover, when the voltage falling waveform is not generated, ground potential can be output precisely to the waveform generating portion with the second switching means, even when the output voltage of the second D/A converter cannot be set precisely to ground potential. Consequently, as in the first invention, malfunctioning of the waveform generating portion due to variations in the characteristics of the D/A converters can be prevented.

According to a fifth invention, in the fourth invention, the first switching means is configured such that the input into the first switching means is switched from ground potential to the output voltage of the first D/A converter after the output of the first D/A converter has settled, and wherein the second switching means is configured such that the input into the second switching means is switched from ground potential to the output voltage of the second D/A converter after the output of the second D/A converter has settled.

Thus, the same operational effect as in the second invention can be attained.

A sixth invention is an inkjet head driving circuit driving an actuator for ink ejection provided on an inkjet head, the invention including at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion, wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter.

With this invention, the same operational effect as in the first invention can be attained.

According to a seventh invention, in the sixth invention, the switching means is configured such that the input into the switching means is switched from the predetermined voltage to the output voltage of the D/A converter after the output of the D/A converter has settled.

Thus, the same operational effect as in the second invention can be attained.

An eighth invention relates to an inkjet head driving circuit driving an actuator for ink ejection provided on an inkjet head, and includes at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion, wherein the switching means is configured such that when the digital signal for generating a voltage rising waveform or a voltage falling waveform with the waveform generating portion is not input into the D/A converter, the input into the switching means is set to the predetermined voltage.

Thus, the same operational effect as in the third invention can be attained.

A ninth invention relates to an inkjet head driving circuit driving an actuator for ink ejection provided on an inkjet head, and includes a first D/A converter that converts a digital signal into a positive analog voltage and outputs the analog voltage, a second D/A converter that converts a digital signal into a negative analog voltage and outputs the analog voltage, a first switching means, whose input can be switched between the output voltage of the first D/A converter and ground potential, and which outputs either that output voltage or ground potential, a second switching means, whose input can be switched between the output voltage of the second D/A converter and ground potential, and which outputs either that output voltage or ground potential, and a waveform generating portion, which generates a voltage rising waveform and outputs it to the actuator when the first switching means outputs the output voltage of the first D/A converter and the second switching means outputs ground potential, and which generates a voltage falling waveform when the first switching means outputs ground potential and the second switching means outputs the output voltage of the second D/A converter, wherein the first switching means is configured such that when the digital signal for generating a voltage rising waveform with the waveform generating portion is input into the first D/A converter, then the input into the first switching means is switched from ground potential to the output voltage of the first D/A converter, and wherein the second switching means is configured such that when the digital signal for generating a voltage falling waveform with the waveform generating portion is input into the second D/A converter, then the input into the second switching means is switched from ground potential to the output voltage of the second D/A converter.

Thus, the same operational effect as in the fourth invention can be attained.

According to a tenth invention, in the ninth invention, the first switching means is configured such that the input into the first switching means is switched from ground potential to the output voltage of the first D/A converter after the output of the first D/A converter has settled, and wherein the second switching means is configured such that the input into the second switching means is switched from ground potential to the output voltage of the second D/A converter after the output of the second D/A converter has settled.

Thus, the same operational effect as in the fifth invention can be attained.

An eleventh invention is an invention of an inkjet recording device, including:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

With this invention, the same operational effect as in the first invention can be attained, and an inkjet recording device with superior ink ejection performance can be easily attained.

According to a twelfth invention, an inkjet recording device includes:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is not input into the D/A converter, the input into the switching means is set to the predetermined voltage; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

With this invention, the same operational effect as in the third invention can be attained, and an inkjet recording device with superior ink ejection performance can be easily attained.

According to a thirteenth invention, an inkjet recording device includes:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises:

a first D/A converter that converts a digital signal into a positive analog voltage and outputs the analog voltage;

a second D/A converter that converts a digital signal into a negative analog voltage and outputs the analog voltage;

a first switching means, whose input can be switched between the output voltage of the first D/A converter and ground potential, and which outputs either that output voltage or ground potential;

a second switching means, whose input can be switched between the output voltage of the second D/A converter and ground potential, and which outputs either that output voltage or ground potential; and a waveform generating portion, which generates a voltage rising waveform and outputs it to the actuator when the first switching means outputs the output voltage of the first D/A converter and the second switching means outputs ground potential, and which generates a voltage falling waveform and outputs it to the actuator when the first switching means outputs ground potential and the second switching means outputs the output voltage of the second D/A converter;

wherein the first switching means is configured such that when the digital signal for generating a voltage rising waveform with the waveform generating portion is input into the first D/A converter, then the input into the first switching means is switched from ground potential to the output voltage of the first D/A converter;

wherein the second switching means is configured such that when the digital signal for generating a voltage falling waveform with the waveform generating portion is input into the second D/A converter, then the input into the second switching means is switched from ground potential to the output voltage of the second D/A converter; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

With this invention, the same operational effect as in the fourth invention can be attained, and the ink ejection performance of the inkjet recording device can be improved with a simple circuit configuration.

BEST MODE FOR CARRYING OUT THE INVENTION

Figure 1:
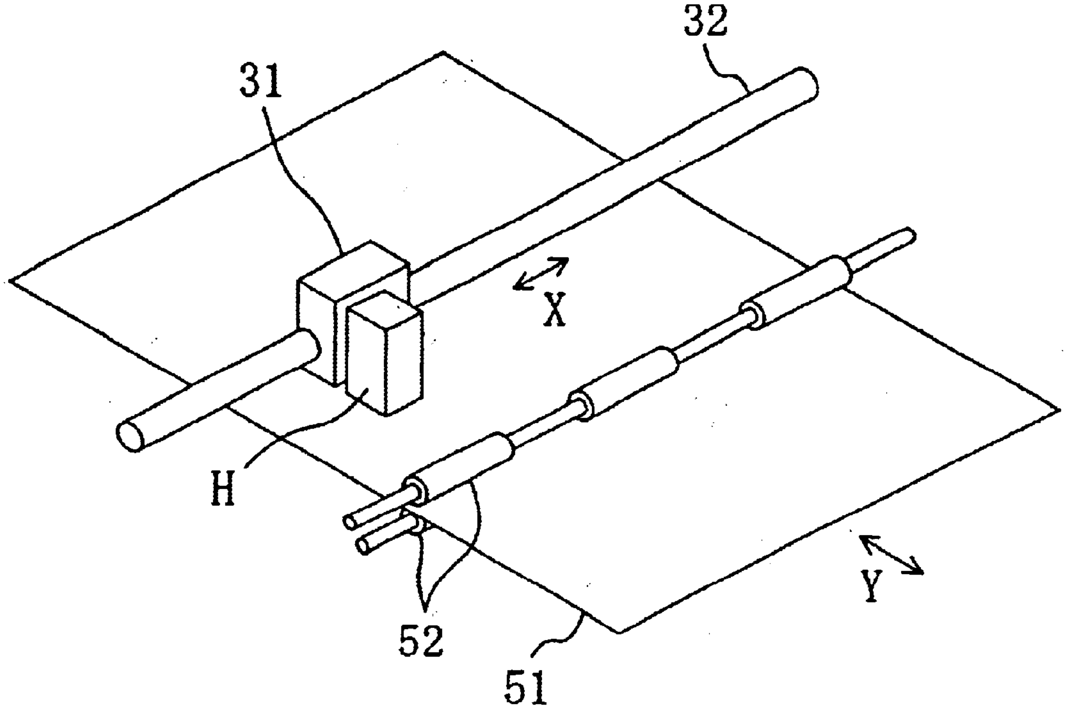
FIG. 1 is a schematic perspective view showing an inkjet recording device in accordance with an embodiment of the present invention.

FIG. 1 schematically shows an inkjet recording device in accordance with an embodiment of the present invention. This inkjet recording device is provided with an inkjet head H that ejects ink onto recording paper 51 serving as a recording medium, as will be described later. The inkjet head H is fixed to and supported by a carriage 31, which is provided with a carriage motor not shown in the drawings, by which the inkjet head H and the carriage 31 are guided on a carriage shaft 32 extending in the primary scan direction (X direction in FIG. 1), moving back and forth in this direction. The carriage 31, the carriage shaft 32 and the carriage motor constitute a relative movement means for moving the inkjet head H relatively to the recording paper 51.

The recording paper 51 is clamped by two feed rollers 52 that are rotatively driven by a feed motor not shown in the drawings. The feed motor and the feed rollers 52 feed the recording paper 51 in a secondary scan direction (Y direction in FIG. 1), which is perpendicular to the primary scan direction, below the inkjet head H.

Figure 2:
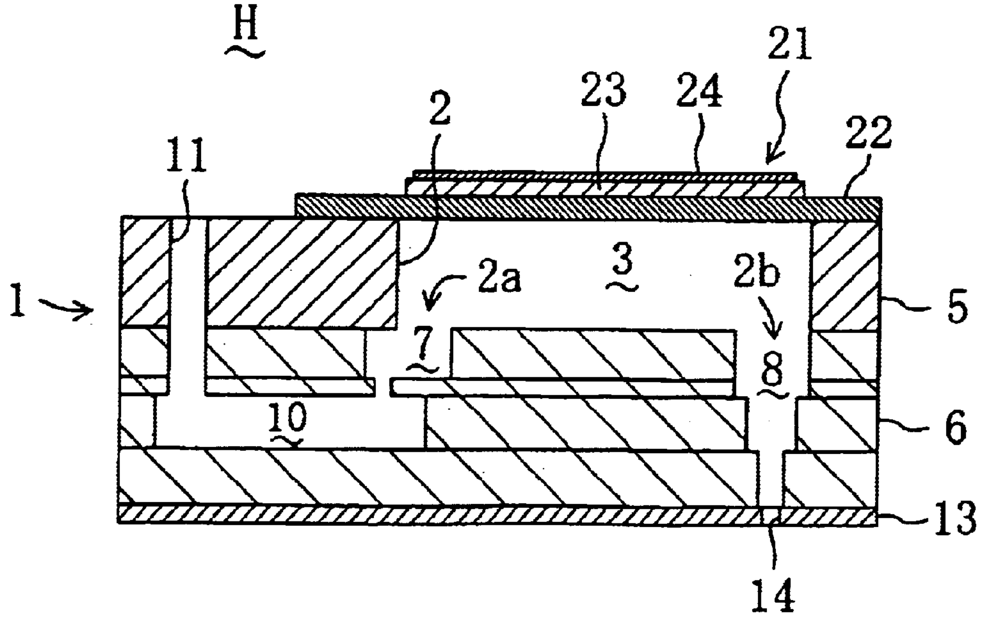
FIG. 2 is a cross-sectional drawing taken along the main scan direction of the inkjet head of the inkjet recording device of FIG. 1.

As shown in FIG. 2, the inkjet head H includes a head body 1, in which a plurality of pressure chamber cavities 2 are formed, which have a supply port 2*a* for supplying ink and an ejection port 2*b* for ejecting ink. The cavities 2 of the head body 1, which are formed in the upper side of the head body 1, are extended in the primary scan direction, and are lined up in the secondary direction, leaving a substantially equal spacing between them.

The lateral wall portions of the cavities 2 of the head body 1 are constituted by a pressure chamber component 5 made of photosensitive glass of about 200 $\mu$m thickness, and the bottom wall portion of the cavities 2 is made of an ink channel component 6 that is affixed to the pressure chamber component 5 and made by laminating a plurality of stainless steel sheets. Inside this ink channel component 6, supply ink channels 7 connected to the supply ports 2*a* of the cavities 2 and ejection ink channels 8 connected to the ejection ports 2*b* of the cavities 2 are formed. Each supply ink channel 7 is connected to an ink supply chamber 10 extending in the same direction in which the cavities 2 are lined up (secondary scan direction). This ink supply chamber 10 is formed by the pressure chamber component 5 and the ink channel component 6, and is connected to an ink supply hole 11 connected to an ink tank outside the drawing.

On the side of the ink channel component 6 that is opposite to the pressure chamber component 5 (i.e. the lower side), a nozzle plate 13 of about 20 $\mu$m thickness is provided, which constitutes the lower side of the inkjet head H and is made of a polymer resin, such as polyimide. Nozzles 14 of about 20 $\mu$m diameter are formed in the nozzle plate 13, and are respectively connected to the ejection ports 2*b* through the ejection ink channel 8. The nozzles 14 are aligned in a row in the secondary scan direction.

In the pressure chamber component 5 of the head body 1, the side opposite the ink channel component 6 (i.e. the upper side) is provided with piezoelectric actuators 21 that cover the cavities 2 of the head body 1 and form the pressure chambers 3 together with the cavities 2. These piezoelectric actuators 21 include a piezoelectric layer 23 of 1 to 10 $\mu$m thickness made of lead zirconium titanate (PZT), an upper electrode layer 24 made of Pt of 0.05 to 0.6 $\mu$m thickness provided on the side of the piezoelectric layer 23 that is opposite the pressure chamber 3 (i.e. the upper side), and a lower electrode layer 22 made of Cr of 1 to 10 $\mu$m thickness provided on the pressure chamber 3 side of the piezoelectric layer 23 (i.e. the lower side). The lower electrode layer 22, which is shared by all piezoelectric actuators 21, is grounded and fulfills the function of a so-called oscillation plate.

Figure 3:
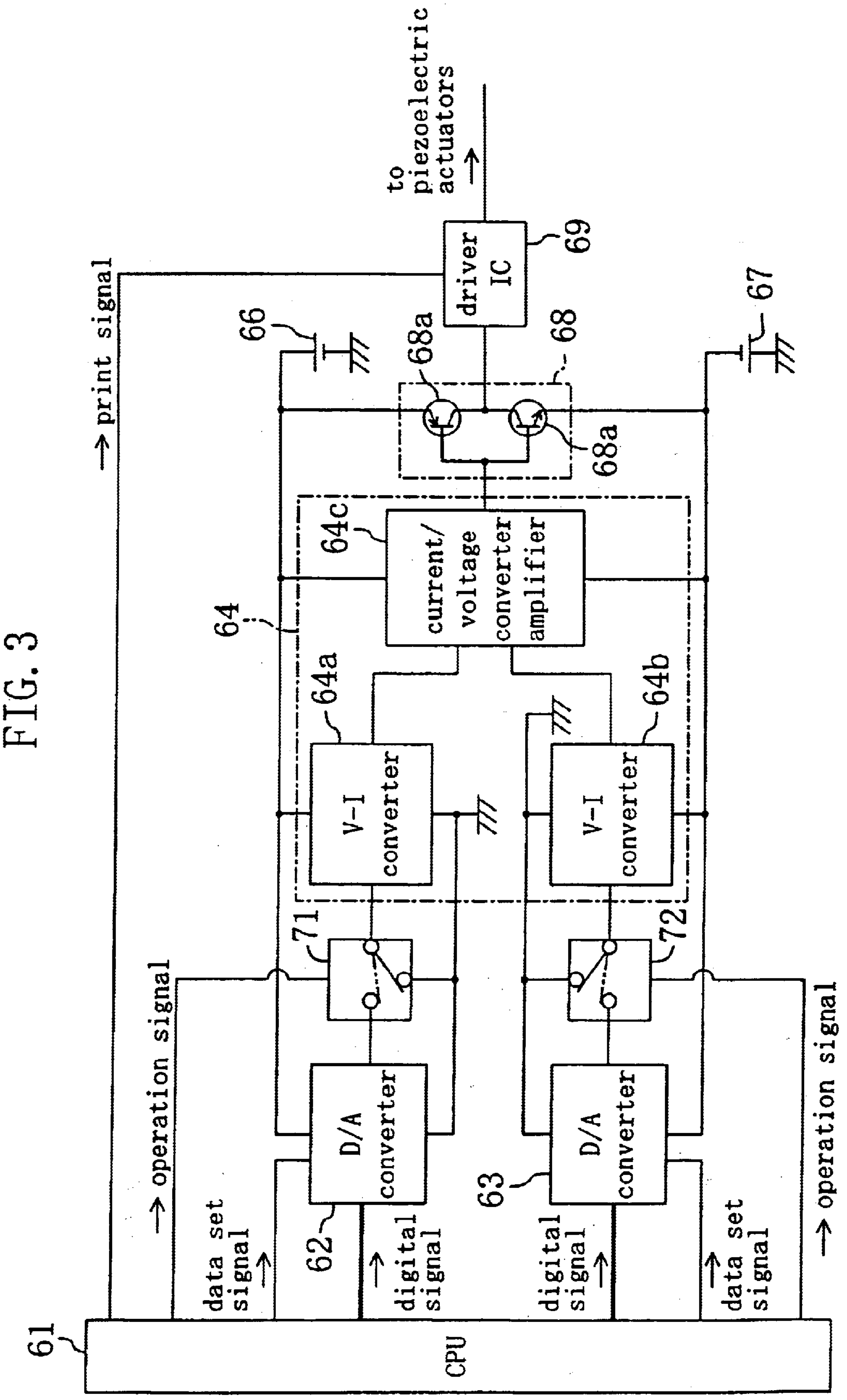
FIG. 3 is a schematic circuit diagram showing an inkjet head driving circuit driving piezoelectric actuators for inkjet ejection provided on an inkjet head.

FIG. 3 shows an inkjet head driving circuit (waveform generating circuit) driving the piezoelectric actuators 21 for ink ejection provided in the inkjet head H. This inkjet head driving circuit includes a CPU 61 having two terminals outputting digital signals (of for example 8 bits) for generating a voltage waveform, and a first and a second D/A converter 62 and 63 connected to the respective digital signal output terminals of the CPU 61.

The first D/A converter 62 receives from the CPU 61 a first data set signal together with the digital signal but from a different terminal than the digital signal, and when this first data set signal has been input and a first predetermined time (data settling time: depends on the output voltage) has elapsed after its input (after the output of the first D/A converter 62 has settled), a positive analog voltage is given out. That is to say, the first D/A converter 62 is connected to a first power source 66 giving out a positive voltage V1, and is configured such that it can output any voltage from ground potential to the output voltage V1 of the first power source 66, depending on the digital signal.

On the other hand, the second D/A converter 63 receives from the CPU 61 a second data set signal together with the digital signal but from a different terminal than the digital signal, and when this second data set signal has been input and a second predetermined time (data settling time: depends on the output voltage) has elapsed after its input (after the output of the second D/A converter 63 has settled), a negative analog voltage is given out. That is to say, the second D/A converter 63 is connected to a second power source 67 giving out a negative voltage −V1, and is configured such that it can output any voltage from ground potential to the output voltage −V1 of the second power source 67, depending on the digital signal.

The output voltage of the first D/A converter 62 (positive analog voltage) is input into the waveform generating portion 64 through a first analog switch 71 serving as a first switching means, whereas the output voltage of the second D/A converter 63 (negative analog voltage) is input into the waveform generating portion 64 through a second analog switch 72 serving as a second switching means.

The first analog switch 71 is configured such that the input into the first analog switch 71 can be switched by an operation signal from the CPU 61 to either the output voltage of the first D/A converter 62 or ground potential (predetermined voltage that is held constant), and that it outputs either that output voltage or ground potential to the waveform generating portion 64. Similarly, the second analog switch 72 is configured such that the input into the second analog switch 72 is switched by an operation signal from the CPU 61 to either the output voltage of the second D/A converter 63 or ground potential (predetermined voltage that is held constant), and that it outputs either that output voltage or ground potential to the waveform generating portion 64.

The waveform generating portion 64 includes a first voltage/current converter 64*a*, which converts the positive analog voltage output from the first D/A converter 62 into a current, a second voltage/current converter 64*b*, which converts the negative analog voltage output from the second D/A converter 63 into a current, and a current/voltage converter amplifier 64*c*. This current/voltage converter amplifier 64*c* amplifies, with a current mirror circuit made of two resistors and two transistors, the currents into which the voltages have been converted by the first and the second voltage/current converter 64*a* and 64*b* (the amplification ratio depending on the resistance ratio between the two resistors), and converts the amplified currents into a voltage with a capacitor. It should be noted that the first voltage/current converter 64*a* is connected to the first power source 66, whereas the second voltage/current converter 64*b* is connected to the second power source 67, and the current/voltage converter amplifier 64*c* is connected to both the first and the second power source 66 and 67.

The waveform generating portion 64 is configured such that when the first analog switch 71 outputs the output voltage of the first D/A converter 62 and the second analog switch 72 outputs ground potential, then the waveform generating portion 64 generates a voltage rising waveform, whereas when the first analog switch 71 outputs ground potential and the second analog switch 72 outputs the output voltage of the second D/A converter 63, then the waveform generating portion 64 generates a voltage falling waveform, and when the first and the second analog switches 71 and 72 both output ground potential, then the waveform generating portion 64 generates a waveform sustaining the potential directly preceding the outputs of ground potential.

That is to say, when the voltage rising waveform is not being generated by the waveform generating portion 64 (when the digital signal for generating a voltage rising waveform with the waveform generating portion 64 is not being input into the first D/A converter 62), then the input into the first analog switch 71 is set to ground potential (the first analog switch 71 is set to the state indicated by the solid line in FIG. 3) and when a digital signal for generating a voltage rising waveform with the waveform generating portion 64 is input into the first D/A converter 62 (when a digital signal is input from the CPU 61 to the first D/A converter 62 that makes the output voltage of the first D/A converter 62 positive), then the input into the first analog switch 71 is switched from ground potential to the output voltage of the first D/A converter 62 (the first analog switch 71 is set to the state indicated by the double-dashed line in FIG. 3). This switching of the input is carried out after the digital signal for generating a voltage rising waveform with the waveform generating portion 64 is input and the output of the first D/A converter 62 has settled.

Similarly, when the voltage falling waveform is not being generated by the waveform generating portion 64 (when the digital signal for generating a voltage falling waveform with the waveform generating portion 64 is not being input into the second D/A converter 63), then the input into the second analog switch 71 is set to ground potential (the second analog switch 72 is set to the state indicated by the solid line in FIG. 3) and when a digital signal for generating a voltage falling waveform with the waveform generating portion 64 is input into the second D/A converter 63 (when a digital signal is input from the CPU 61 to the second D/A converter 63 that makes the output voltage of the second D/A converter 63 negative), then the input into the second analog switch 72 is switched from ground potential to the output voltage of the second D/A converter 63 (the second analog switch 72 is set to the state indicated by the double-dashed line in FIG. 3). This switching of the input is carried out after the digital signal for generating a voltage falling waveform with the waveform generating portion 64 is input and the output of the second D/A converter 63 has settled.

It should be noted that a latch signal is input from the CPU 61 to the first and the second D/A converters 62 and 63 through terminals different than for the digital signals and the data set signals, and that the output state of the analog voltage is maintained by the input of the latch signal.

The output terminal of the waveform generating portion 64 is connected via a current amplifier 68, which is made of two transistors 68*a*, and a driver IC 69 to the upper electrode layer 24 of the piezoelectric actuators 21 of the inkjet head H. The driver IC 69 includes for example switching transistors provided in correspondence with the piezoelectric actuators 21, and, receiving print signals from the CPU 61, selects the piezoelectric actuators 21 corresponding to the nozzles 14 through which ink drops are to be ejected, thus applying the voltage waveform that is generated and output by the waveform generating portion 64 only to the selected actuators 21.

Figure 4:
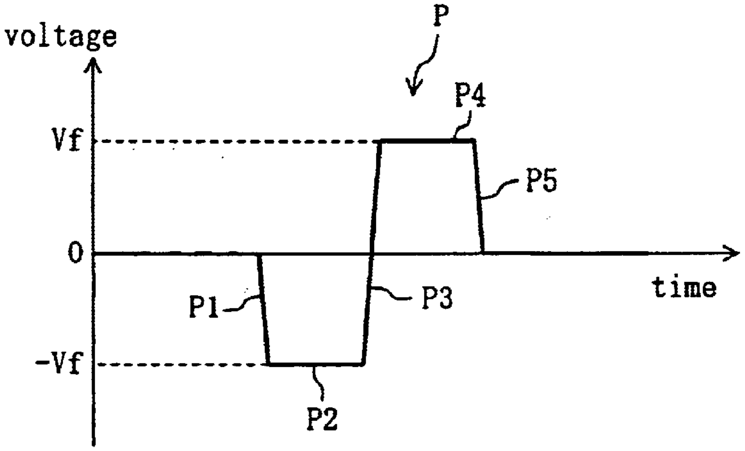
FIG. 4 is a waveform diagram showing an example of a voltage waveform applied to the piezoelectric actuators.

As shown for example in FIG. 4, the voltage waveform applied to the piezoelectric actuators 21 is made of a first waveform P1 (voltage falling waveform), at which the potential falls from ground potential to the minimum potential (−Vf), a second waveform P2 continuing the first waveform P1 and maintaining this minimum potential, a third waveform P3 (voltage rising waveform) continuing the second waveform P2 and rising from the minimum potential to the maximum potential (Vf), a fourth waveform P4 continuing the third waveform P3 and maintaining this maximum potential, and a fifth waveform P5 (voltage falling waveform) continuing the fourth waveform P4 and returning from the maximum potential to ground potential. This series of first to fifth waveforms P1 to P5 constitutes one driving pulse P for ejecting one ink drop from the nozzle, and the driving pulse P is given out repeatedly with a predetermined period (for example about 50 μs, i.e. a driving frequency of 20 kHz). The potential between neighboring driving pulses P is maintained at ground potential. That is to say, the driving pulse P is of the pull-push-pull type with ground potential as the reference potential.

Figure 5:
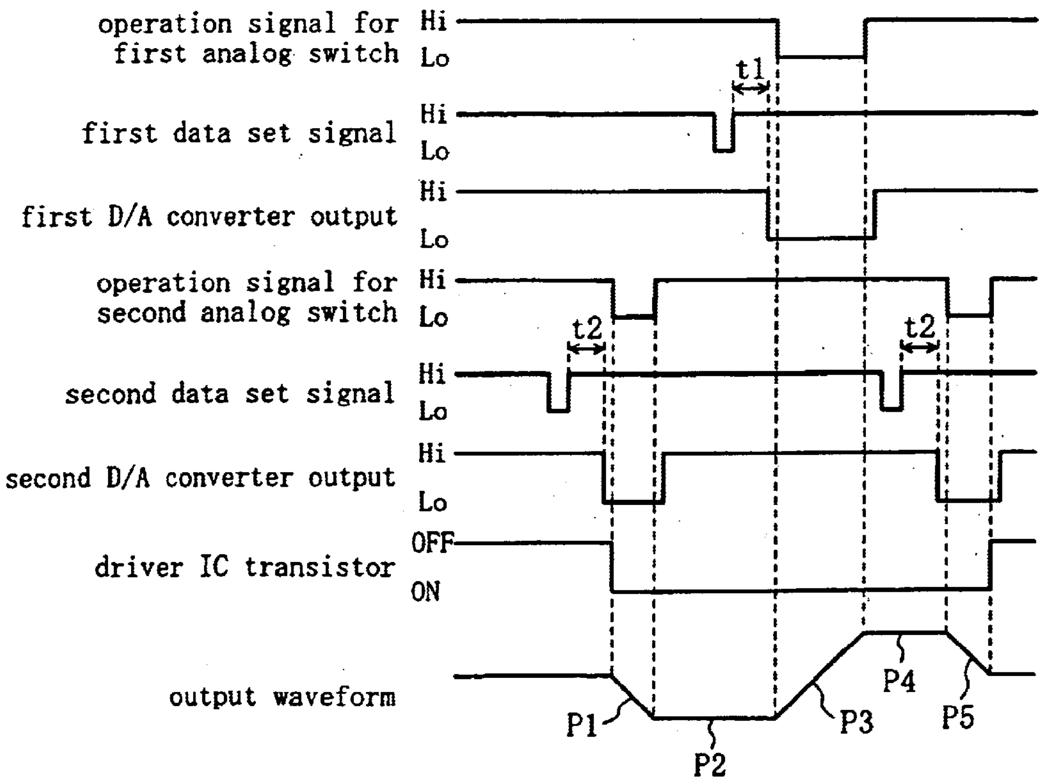
FIG. 5 is a time-chart for generating the voltage waveform in FIG. 4 with the inkjet head driving circuit in FIG. 3.
Figure 6:
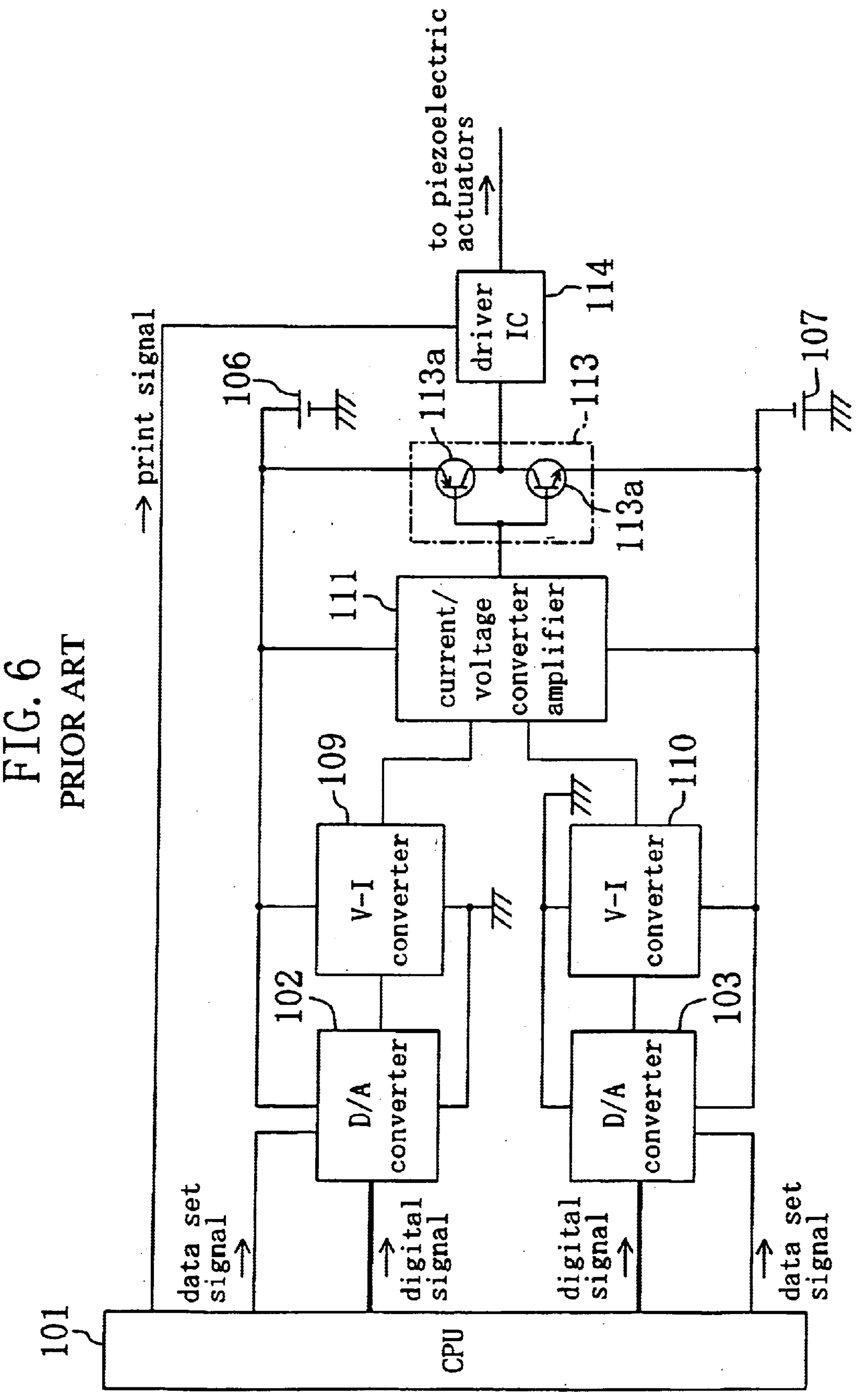
FIG. 6 PRIOR ART
FIG. 6 is a schematic circuit diagram showing a conventional inkjet head driving circuit.

Next, the operation of an inkjet head driving circuit for generating these first to fifth waveforms P1 to P5 is explained with FIG. 5.

At the stage before generating the waveforms, the first and second analog switches 71 and 72 receive an operation signal (Hi state in FIG. 5) from the CPU 61, whereby ground potential is input into them, and thus, the waveform generating portion 64 outputs ground potential.

Next, a second data set signal and a digital signal that makes the output voltage of the second D/A converter 63 negative are output from the CPU 61 to the second D/A converter 63, and after a second predetermined time (time t2 in FIG. 5) has elapsed after the input of the second data set signal, the output of the second D/A converter 63 is settled, and a negative analog voltage is output (in FIG. 5, the Lo state is assumed during the output of the negative analog voltage). It should be noted that this output state is maintained by the above-mentioned latch signal.

Then, after the output of the second D/A converter 63 has settled and a negative analog voltage has been output (after a time that is slightly longer than the maximum value of the data settling time has elapsed after the input of the second data set signal), the input into the second analog switch 72 is switched, with an operation signal from the CPU 61 (Lo state in FIG. 5), from ground potential to the output voltage of the second D/A converter 63. On the other hand, the input into the first analog switch 71 stays at ground potential. Thus, the waveform generating portion 64 generates/outputs the first waveform P1, at which the potential falls from ground potential to the minimum potential, with the current/voltage converter amplifier 64*c*. It should be noted that substantially at the same time as the switching of the input into the second analog switch 72, the driver IC 69 sets the switching transistors corresponding to the selected piezoelectric actuators 21 to the ON state, and this state is continued substantially until the end of the generation of the fifth waveform P5.

After that, at substantially the same time as the end of the generation of the first waveform P1, the input into the second analog switch 72 is switched from the output voltage of the second D/A converter 63 to ground potential. Also in this situation, the input into the first analog switch 71 stays at ground potential. Thus, the waveform generating portion 64 generates/outputs the second waveform P2, maintaining the minimum potential. It should be noted that substantially at the same time as the end of the generation of the first waveform P1 or after that, the maintaining of the output state of the D/A converter 62 due to the latch signal is terminated.

Subsequently, a first data set signal and a digital signal that makes the output voltage of the first D/A converter 62 positive are output from the CPU 61 to the D/A converter 62, and after a first predetermined time (time t1 in FIG. 5) has elapsed after the input of the first data set signal, the output of the first D/A converter 62 is settled, and a positive analog voltage is output (in FIG. 5, the Lo state is assumed during the output of the positive analog voltage). It should be noted that this output state is maintained by the above-mentioned latch signal.

Then, after the output of the first D/A converter 62 has settled and a positive analog voltage has been output (after a time that is slightly longer than the maximum value of the data settling time has elapsed after the input of the first data set signal), the input into the first analog switch 71 is switched, with an operation signal from the CPU 61 (Lo state in FIG. 5), from ground potential to the output voltage of the first D/A converter 62. On the other hand, the input into the second analog switch 72 stays at ground potential. Thus, the waveform generating portion 64 generates/outputs the third waveform P3, at which the potential rises from the minimum potential to the maximum potential, with the current/voltage converter amplifier 64*c*.

After that, at substantially the same time as the end of the generation of the third waveform P3, the input into the first analog switch 71 is switched from the output voltage of the first D/A converter 62 to ground potential. Also in this situation, the input into the second analog switch 72 stays at ground potential. Thus, the waveform generating portion 64 generates/outputs the fourth waveform P4, maintaining the minimum potential.

Next, a second data set signal and a digital signal that makes the output voltage of the second D/A converter 63 negative are output from the CPU 61 to the second D/A converter 63, and when the output of the second D/A converter 63 has settled, a negative analog voltage is output. Then, after the output of the second D/A converter 63 has settled and a negative analog voltage has been output (after a time that is slightly longer than the maximum value of the data settling time has elapsed after the input of the second data set signal), the input into the second analog switch 72 is switched from ground potential to the output voltage of the second D/A converter 63. On the other hand, the input into the first analog switch 71 stays at ground potential. Thus, the waveform generating portion 64 generates/outputs the fifth waveform P5, at which the potential falls from the maximum potential to ground potential, with the current/voltage converter amplifier 64*c*.

Subsequently, after the end of the generation of the fifth waveform P5, the input into the second analog switch 72 is switched from the output voltage of the second D/A converter 63 to ground potential. Also in this situation, the input into the first analog switch 71 stays at ground potential. Thus, the waveform generating portion 64 outputs ground potential until the next driving pulse P is generated.

It should be noted that while ground potential is input into the first and the second analog switch 71 and 72, the output voltage of the first and second D/A converters 62 and 63 can be ground potential, or it can be another potential.

The operation of the inkjet head H is as follows: when the first waveform P1 generated/output by the waveform generating portion 64 is applied to the piezoelectric actuator 21, the piezoelectric layer 23 expands in the direction perpendicular to its thickness direction, due to the electric field created inside the piezoelectric layer 23, whereas the lower electrode layer 22 and the upper electrode layer 24 do not expand, so that due to the so-called bi-metal effect, a portion of the piezoelectric actuator 21 that corresponds to the pressure chamber 3 is deformed and bent such that it becomes convex on the side opposite the pressure chamber 3.

Then, when the third waveform P3 is applied to the piezoelectric actuator 21, the piezoelectric layer 23 contracts, and the portion of the piezoelectric actuator 21 that corresponds to the pressure chamber 3 is deformed and bent such that it becomes convex on the side of the pressure chamber 3. This bend deformation causes a pressure inside the pressure chamber 3, and due to this pressure, a predetermined amount of the ink in the pressure chamber 3 is ejected via the ejection port 2*b* and the ejection ink channel 8 and through the nozzle 14 onto the recording paper 51, adhering in dot shape to the recording paper 51.

Next, when the fifth waveform P5 is applied to the piezoelectric actuator 21, the piezoelectric layer 23 expands, and the portion of the piezoelectric actuator 21 that corresponds to the pressure chamber 3 is returned to its original state. During the application of the first and the fifth waveforms P1 and P5, ink is filled from the ink supply chamber 10 via the supply ink channel 7 and the supply port 2*a* into the pressure chamber 3.

The application of the voltage waveform to the piezoelectric actuator 21 is carried out repeatedly at an output period of the driving pulse P while the inkjet head H and the carriage 31 are moved at substantially constant speed in the primary scan direction from one end of the recording paper 51 to the other (however, when the inkjet head H has reached a location on the recording paper 51 onto which no ink drop is shot, the voltage waveform is not applied by the driver IC 69), and thus ink drops are shot onto predetermined positions of the recording paper 51. Then, when the recording for one scan line has been finished, the recording paper 51 is fed by the feed motor and the feed rollers 52 for a predetermined amount in the secondary scan direction, and ink drops are ejected again while the inkjet head H and the carriage 31 are moved in the primary scan direction, and the recording for the next scan line is carried out. By repeating this operation, the desired image is formed over the entire recording paper 51.

Consequently, with this embodiment, when the voltage rising waveform is not being generated by the waveform generating portion 64 (when the digital signal for generating a voltage rising waveform with the waveform generating portion 64 is not being input into the first D/A converter 62), then the input into the first analog switch 71 is set to ground potential, so that ground potential is output to the waveform generating portion 64, regardless of the output voltage of the first D/A converter 62. And when the voltage falling waveform is not being generated (when the digital signal for generating a voltage falling waveform with the waveform generating portion 64 is not being input into the second D/A converter 63), then the input into the second analog switch 72 is set to ground potential, so that ground potential is output to the waveform generating portion 64, regardless of the output voltage of the second D/A converter 63. That is to say, even if digital signals setting the output voltages of the first and second D/A converters 62 and 63 to the same voltage as ground potential are output by the CPU 61 to the D/A converter 62 and 63, there is the possibility that the output of the D/A converters 62 and 63 deviates slightly from ground potential due to variations in the characteristics of the D/A converter 62 and 63, but in this embodiment, ground potential is output precisely to the waveform generating portion 64 with the first and second analog switches 71 and 72, so that malfunctioning of the waveform generating portion 64 due to variations in the characteristics of the D/A converters 62 and 63 can be prevented. As a consequence, the ink ejection performance of the inkjet recording device can be improved with a simple circuit configuration.

Furthermore, when a voltage rising waveform (voltage falling waveform) is generated by the waveform generating portion 64 (when a digital signal for generating a voltage rising waveform (voltage falling waveform) with the waveform generating portion 64 is input into the first D/A converter 62 (second D/A converter 63)), then the input into the first analog switch 71 (second analog switch 72) is switched from ground potential to the output voltage of the first D/A converter 62 (second D/A converter 63), and in this situation, the switch is made after the output of the first D/A converter 62 (second D/A converter 63) has settled, so that the waveform generation timing can be controlled with the first analog switch 71 (second analog switch 72). That is to say, the first predetermined time t1 (second predetermined time t2) from the input of the first data set signal (second data set signal) until the output of the first D/A converter 62 (first D/A converter 63) has settled fluctuates depending on its output voltage and variations in its characteristics, so that if there is no first analog switch 71 (second analog switch 72), or even if there is the first analog switch 71 (second analog switch 72), but the input into the first analog switch 71 (second analog switch 72) is switched to the output voltage of the first D/A converter 62 (second D/A converter 63) before the output of the first D/A converter 62 (second D/A converter 63) has settled, then the result is variations in the generation/output timing of the voltage rising waveform or the voltage falling waveform by the waveform generating portion 64. However, in this embodiment, the input into the first analog switch 71 (second analog switch 72) is switched to the output voltage of the first D/A converter 62 (second D/A converter 63) only after the output of first D/A converter 62 (second D/A converter 63) has settled, so that the voltage rising waveform or voltage falling waveform can be generated/output substantially at the same time as the switching of the input into the first analog switch 71 (second analog switch 72). As a result, variations in the waveform generating timing brought about by fluctuations in the output settling time of the first D/A converter 62 (second D/A converter 63) are prevented, and voltage waveforms can be generated/output at an ordinarily constant timing. Thus, variations in the ink ejection amount can be suppressed to a rather small amount, and the positional precision with which ink drops are shot onto the recording paper 51 can be improved, attaining a high image quality.

It should be noted that in this embodiment, the input into the first analog switch 71 (second analog switch 72) is switched from ground potential to the output voltage of the first D/A converter 62 (second D/A converter 63) after the output of the first D/A converter 62 (second D/A converter 63) has settled, but it is also possible to make the switch before the output of the first D/A converter 62 (second D/A converter 63) has settled (for example, at the same time as the digital signal for generating the voltage rising waveform (voltage falling waveform) with the waveform generating portion 64 is input into the first D/A converter 62 (second D/A converter 63)). Also in this case, a malfunctioning of the waveform generating portion 64 due to variations in the characteristics of the D/A converters 62 or 63 can be prevented. However, for example with regard to improving the positional precision with which the ink drops are shot, it is preferable that the above-described embodiment is adopted.

Furthermore, in the above embodiment, a driving pulse P including a voltage rising waveform and a voltage falling waveform was generated by the two D/A converters 62 and 63 and the waveform generating portion 64, but the present invention can be applied to any waveform generating circuit including at least one D/A converter and a waveform generating portion into which the output voltage of this D/A converter is input and that generates at least one of a voltage rising waveform and a voltage falling waveform in response to the value of that output voltage. In that case, as in the abovedescribed embodiment, an analog switch whose input can be switched between the output voltage of the D/A converter and a predetermined voltage that is held constant should be provided between the D/A converters and the waveform generating portion, and either of those two voltages should be output to the waveform generating portion. Moreover, the waveform generating portion should be configured such that depending on whether the output voltage of the D/A converter is larger or smaller than the predetermined voltage, a voltage rising waveform or a voltage falling waveform is generated. Depending on the voltage waveform to be generated, the predetermined voltage is not limited to ground voltage, and can be a constant predetermined voltage that is midway between the maximum value and the minimum value of the output voltage of the D/A converter, and if such a predetermined voltage is obtained for example from the output voltage of a constant voltage source, then a precise constant voltage can be obtained.

Furthermore, in the above embodiments, the waveform generating circuit was applied to an inkjet head driving circuit driving the piezoelectric actuators 21 of an inkjet head H in an inkjet recording device, but the waveform generating circuit of the present invention can be applied to any device that drives by applying a voltage pulse having a voltage rising waveform and a voltage falling waveform.

Industrial Applicability

The present invention is useful for devices on which actuators are mounted that are driven by application of voltage pulses, in particular for inkjet recording devices provided with actuators for ink ejection, and its industrial applicability is high in that it can prevent malfunctioning of the waveform generating portion due to variations in the characteristics of the D/A converters with a simple configuration.

What is claimed is:

1. A waveform generating circuit, comprising:

at least one D/A converter that converts a digital signal into an analog voltage and outputs the analog voltage;

a waveform generating portion into which an output voltage of the D/A converter is input, and which generates at least one of a voltage rising waveform and a voltage falling waveform in response to a value of that output voltage; and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter.

2. The waveform generating circuit according to claim 1, wherein the switching means is configured such that the input into the switching means is switched from the predetermined voltage to the output voltage of the D/A converter after the output of the D/A converter has settled.

3. A waveform generating circuit, comprising:

at least one D/A converter that converts a digital signal into an analog voltage and outputs the analog voltage;

a waveform generating portion into which an output voltage of the D/A converter is input, and which generates at least one of a voltage rising waveform and a voltage falling waveform in response to a value of that output voltage; and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is not input into the D/A converter, the input into the switching means is set to the predetermined voltage.

4. A waveform generating circuit, comprising:

a first D/A converter that converts a digital signal into a positive analog voltage and outputs the analog voltage;

a second D/A converter that converts a digital signal into a negative analog voltage and outputs the analog voltage;

a first switching means, whose input can be switched between the output voltage of the first D/A converter and ground potential, and which outputs either that output voltage or ground potential;

a second switching means, whose input can be switched between the output voltage of the second D/A converter and ground potential, and which outputs either that output voltage or ground potential; and a waveform generating portion, which generates a voltage rising waveform when the first switching means outputs the output voltage of the first D/A converter and the second switching means outputs ground potential, and which generates a voltage falling waveform when the first switching means outputs ground potential and the second switching means outputs the output voltage of the second D/A converter;

wherein the first switching means is configured such that when the digital signal for generating a voltage rising waveform with the waveform generating portion is input into the first D/A converter, then the input into the first switching means is switched from ground potential to the output voltage of the first D/A converter; and wherein the second switching means is configured such that when the digital signal for generating a voltage falling waveform with the waveform generating portion is input into the second D/A converter, then the input into the second switching means is switched from ground potential to the output voltage of the second D/A converter.

5. The waveform generating circuit according to claim 4, wherein the first switching means is configured such that the input into the first switching means is switched from ground potential to the output voltage of the first D/A converter after the output of the first D/A converter has settled; and wherein the second switching means is configured such that the input into the second switching means is switched from ground potential to the output voltage of the second D/A converter after the output of the second D/A converter has settled.

6. An inkjet head driving circuit driving an actuator for ink ejection provided on an inkjet head, comprising:

at least one D/A converter that converts a digital signal into an analog voltage and outputs the analog voltage;

a waveform generating portion into which an output voltage of the D/A converter is input, and which generates at least one of a voltage rising waveform and a voltage falling waveform in response to a value of that output voltage, and outputs it to the actuator; and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter.

7. The inkjet head driving circuit according to claim 6, wherein the switching means is configured such that the input into the switching means is switched from the predetermined voltage to the output voltage of the D/A converter after the output of the D/A converter has settled.

8. An inkjet head driving circuit driving an actuator for ink ejection provided on an inkjet head, comprising:

at least one D/A converter that converts a digital signal into an analog voltage and outputs the analog voltage;

a waveform generating portion into which an output voltage of the D/A converter is input, and which generates at least one of a voltage rising waveform and a voltage falling waveform in response to a value of that output voltage, and outputs it to the actuator; and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is not input into the D/A converter, the input into the switching means is set to the predetermined voltage.

9. An inkjet head driving circuit driving an actuator for ink ejection provided on an inkjet head, comprising:

a first D/A converter that converts a digital signal into a positive analog voltage and outputs the analog voltage;

a second D/A converter that converts a digital signal into a negative analog voltage and outputs the analog voltage;

a first switching means, whose input can be switched between the output voltage of the first D/A converter and ground potential, and which outputs either that output voltage or ground potential;

a second switching means, whose input can be switched between the output voltage of the second D/A converter and ground potential, and which outputs either that output voltage or ground potential; and a waveform generating portion, which generates a voltage rising waveform and outputs it to the actuator when the first switching means outputs the output voltage of the first D/A converter and the second switching means outputs ground potential, and which generates a voltage falling waveform and outputs it to the actuator when the first switching means outputs ground potential and the second switching means outputs the output voltage of the second D/A converter;

wherein the first switching means is configured such that when the digital signal for generating a voltage rising waveform with the waveform generating portion is input into the first D/A converter, then the input into the first switching means is switched from ground potential to the output voltage of the first D/A converter; and wherein the second switching means is configured such that when the digital signal for generating a voltage falling waveform with the waveform generating portion is input into the second D/A converter, then the input into the second switching means is switched from ground potential to the output voltage of the second D/A converter.

10. The inkjet head driving circuit according to claim 9, wherein the first switching means is configured such that the input into the first switching means is switched from ground potential to the output voltage of the first D/A converter after the output of the first D/A converter has settled; and wherein the second switching means is configured such that the input into the second switching means is switched from ground potential to the output voltage of the second D/A converter after the output of the second D/A converter has settled.

11. An inkjet recording device, comprising:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is input into the D/A converter, the input into the switching means is switched from the predetermined voltage to the output voltage of the D/A converter; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

12. An inkjet recording device, comprising:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises at least one D/A converter that converts a digital signal into an analog voltage and outputs the analog voltage, a waveform generating portion into which an output voltage of the D/A converter is input, and which generates at least one of a voltage rising waveform and a voltage falling waveform in response to a value of that output voltage, and outputs it to the actuator, and a switching means, whose input can be switched between the output voltage of the D/A converter and a predetermined voltage that is held constant, and which outputs one of those two output voltages to the waveform generating portion;

wherein the switching means is configured such that when the digital signal for generating a voltage rising waveform or a voltage falling waveform with the waveform generating portion is not input into the D/A converter, the input into the switching means is set to the predetermined voltage; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

13. An inkjet recording device, comprising:

an inkjet head having a pressure chamber filled with ink, a nozzle linked to the pressure chamber, and an actuator that is caused to eject the ink inside the pressure chamber through the nozzle by application of a voltage;

a relative movement means that moves the inkjet head and a recording medium relatively to one another; and an inkjet head driving circuit driving the actuator of the inkjet head;

wherein the inkjet head driving circuit comprises:

a first D/A converter that converts a digital signal into a positive analog voltage and outputs the analog voltage;

a second D/A converter that converts a digital signal into a negative analog voltage and outputs the analog voltage;

a first switching means, whose input can be switched between the output voltage of the first D/A converter and ground potential, and which outputs either that output voltage or ground potential;

a second switching means, whose input can be switched between the output voltage of the second D/A converter and ground potential, and which outputs either that output voltage or ground potential; and a waveform generating portion, which generates a voltage rising waveform and outputs it to the actuator when the first switching means outputs the output voltage of the first D/A converter and the second switching means outputs ground potential, and which generates a voltage falling waveform and outputs it to the actuator when the first switching means outputs ground potential and the second switching means outputs the output voltage of the second D/A converter;

wherein the first switching means is configured such that when the digital signal for generating a voltage rising waveform with the waveform generating portion is input into the first D/A converter, then the input into the first switching means is switched from ground potential to the output voltage of the first D/A converter;

wherein the second switching means is configured such that when the digital signal for generating a voltage falling waveform with the waveform generating portion is input into the second D/A converter, then the input into the second switching means is switched from ground potential to the output voltage of the second D/A converter; and wherein recording is performed by ejecting ink from the nozzle of the inkjet head onto the recording medium by outputting to the actuator the voltage waveform generated by the waveform generating portion of the inkjet head driving circuit when the inkjet head is moved in relation to the recording medium by the relative movement means.

* * * * *